United States Patent [19]

Shibata

[11] Patent Number: 5,473,278

[45] Date of Patent: Dec. 5, 1995

[54] FILTER CIRCUIT INCLUDING A SWITCH CIRCUIT INSERTED BETWEEN INPUT TERMINAL AND RC FILTER

[75] Inventor: Hirohiko Shibata, Tokyo, Japan

[73] Assignee: NEC Corporation, Tokyo, Japan

[21] Appl. No.: 196,552

[22] Filed: Feb. 15, 1994

[30] Foreign Application Priority Data

Feb. 15, 1993 [JP] Japan .................. 5-024620

[51] Int. Cl.$^6$ .................................. H03B 1/00
[52] U.S. Cl. .................... 327/552; 327/554; 327/94; 327/172
[58] Field of Search ..................... 307/520, 521, 307/255, 260, 265; 328/167; 327/551, 552, 554, 94, 172

[56] References Cited

U.S. PATENT DOCUMENTS

| 4,306,203 | 12/1981 | Sasaki et al. ................ 333/173 |
| 4,551,683 | 11/1985 | Matsuo et al. ................ 307/520 |
| 4,691,171 | 9/1987 | Van Roermund et al. ........ 307/520 |
| 4,791,379 | 12/1988 | Hughes ........................ 307/521 |
| 4,888,502 | 12/1989 | Jarrett ........................ 307/521 |
| 5,245,646 | 9/1993 | Jackson et al. ................ 307/521 |
| 5,345,119 | 9/1994 | Khoury ........................ 328/167 |

FOREIGN PATENT DOCUMENTS 2077557 12/1981 United Kingdom .............. 307/520

Primary Examiner—Timothy P. Callahan
Assistant Examiner—Kenneth B. Wells
Attorney, Agent, or Firm—Sughrue, Mion, Zinn, Macpeak & Seas

[57] ABSTRACT

A RC filter circuit is disclosed which includes a first time constant circuit composed of a first resistor and a first capacitor, a switch circuit transferring, when conductive, an input signal to the first time constant circuit, and a pulse generator generating and supplying a pulse signal to the switch circuit to control conductive and non-conductive states of the switch circuit. The pulse generator includes a second time constant circuit composed of a second resistor and a second capacitor and responding a clock signal to generate the pulse signal which has a cycle period dependent on the clock signal and a pulse width dependent on a time constant of the second time constant circuit.

8 Claims, 4 Drawing Sheets

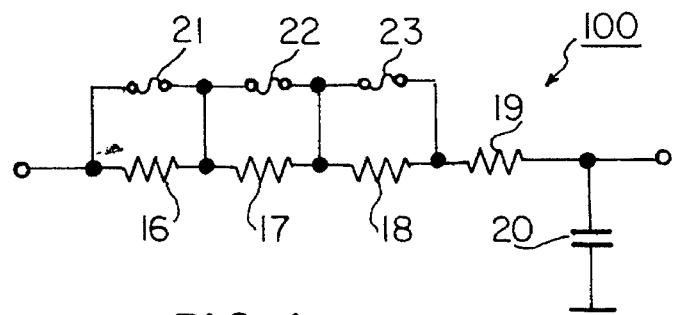
FIG.1 PRIOR ART
FIG.2
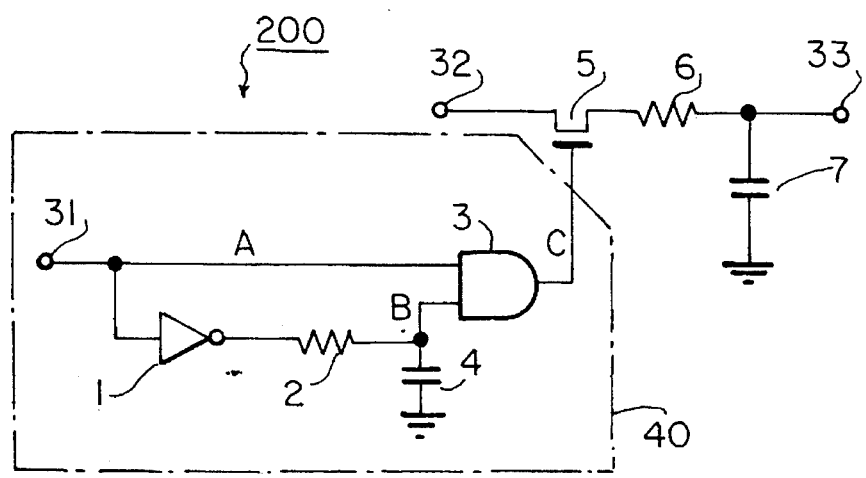
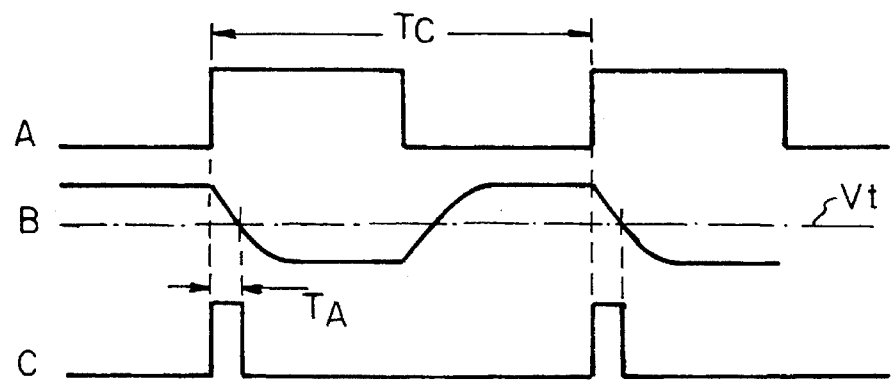
FIG.3

FILTER CIRCUIT INCLUDING A SWITCH CIRCUIT INSERTED BETWEEN INPUT TERMINAL AND RC FILTER

BACKGROUND OF THE INVENTION

The present invention relates to a filter circuit and, more particularly, to a filter circuit composed of a capacitor and a resistor (called hereinafter a "RC filter circuit") incorporated in an integrated circuit device.

A RC filter circuit is used for forming a signal to eliminate a noise component contained therein or converting the wave-form of the signal. The time constant of the RC filter circuit is dependent on the respective values of the capacitor and the resistor. It is, however, unavoidable that the actual values of the capacitor and the resistor deviate from the designed values thereof. In general, each of the capacitor and the resistor has the deviate by 20–30% from the designed value, so that the cut-off frequency of the band pass filter characteristic determined by the time constant of the RC filter circuit often deviates more than 50%. It is therefore required to adjust the time constant of the RC filter circuit. For this purpose, the so-called raiser trimming technique is employed to adjust the value of the resistor and/or the capacitor.

Referring to FIG. 1, the RC filter circuit 100 according to the prior art includes a resistance compensation circuit for adjusting the resistance value of the resistor in the RC filter circuit. Specifically, this circuit 100 includes a resistor series circuit composed of four resistors 16–19 connected in series between an input terminal 101 and an output terminal 102. The circuit 100 further includes a capacitor 20 connected between the output terminal 102 and a ground terminal, and fuses 21–23 connected in parallel to the resistors 16–19, respectively. The resistor 19 has such a resistance value as representing a desired time constant of the circuit 100 when the capacitor 200 has the maximum deviation from the designed value. Each of the resistors 16–18 are thus employed as a compensation resistor. Accordingly, the value of the capacitor 20 is measured by a test equipment, so that zero, one, or more of the fuses 21–23 are blown to adjust the value of the total resistance such that the filter circuit 100 has the desired or intended time constant.

However, in the circuit 100, the test equipment for adjusting the time constant is needed, and adjusting steps are also needed. Moreover, the stress caused by blowing the fuse 21, 22 or 23 is applied to, and may change a semiconductor chip which includes circuit 100.

SUMMARY OF THE INVENTION

It is therefore an object of the present invention to provide an improved RC filter circuit incorporated into an integrated circuit device.

It is another object of the present invention to provide a RC filter circuit presenting an accurate cut-off frequency without adjusting the time constant thereof.

A filter circuit according to the present invention includes a first time constant circuit composed of a first resistor and a first capacitor, a switch circuit transferring, when conductive, an input signal to the first time constant circuit, and a pulse generator generating and supplying a pulse signal to the switch circuit to control the conductive and non-conductive states of the switch circuit, the pulse generator including a second time constant circuit composed of a second resistor and a second capacitor and responding to a clock signal to generate the pulse signal which has a cycle period dependent on the clock signal and a pulse width dependent on a time constant of the second time constant circuit.

With such a circuit construction, the cut-off frequency of the filter circuit is determined by the ratios in value between the first and second resistors and between the first and second capacitors. Such a ratio becomes accurate in an integrated circuit device, so that the cut-off frequency also becomes accurate.

BRIEF DESCRIPTION OF THE DRAWINGS

The above and other objects, features and advantages of the present invention will be more apparent from the following detailed description taken in conjunction with the accompanying drawings, wherein:

FIG. 1 is a circuit diagram illustrative of a RC filter circuit according to the prior art;

FIG. 2 is a circuit diagram illustrative of a RC filter circuit according to a first embodiment of the present invention;

FIG. 3 is a timing chart indicative of an operation of a compensation circuit in the circuit shown in FIG. 2;

DETAILED DESCRIPTION OF THE PREFERRED EMBODIMENTS

Figure 4:
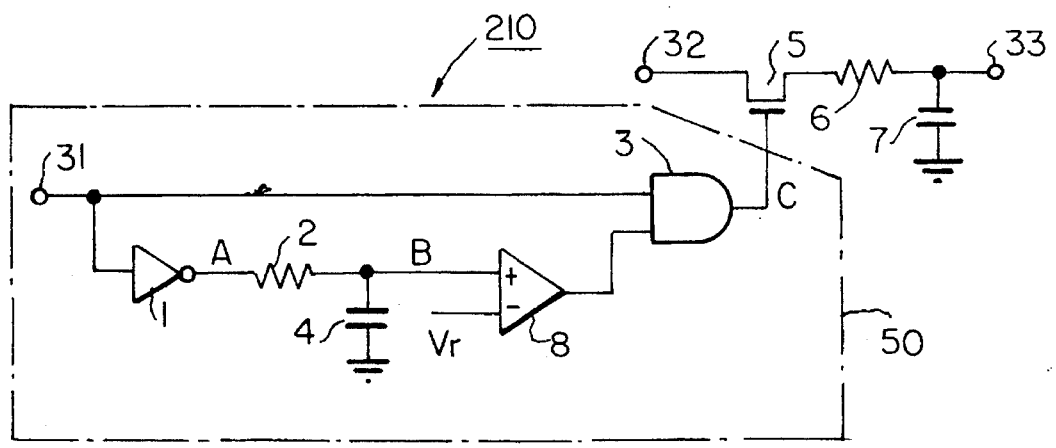
FIG. 4 is a circuit diagram illustrative of a second embodiment of the present invention.

Referring to FIG. 2, a RC filter circuit 200 according to a first embodiment of the present invention includes a capacitor 7 connected between an output terminal 33 and a ground terminal, and a resistor 6 having one end connected to the output terminal 33. The other end of the resistor 6 is connected to an input terminal 32 through an MOS transistor 5, serving as a switch, provided in accordance with the present invention. The transistor 5 is controlled by a compensation circuit 40 which is also provided in accordance with the present invention. The compensation circuit 40 includes an AND gate 3 having a first input node A connected to a clock terminal 31, supplied with a clock signal, and an output node C connected to the gate of the transistor 5. The AND gate has a second input node B which is, in turn, connected through a capacitor 4 to the ground terminal and further through a resistor 2 and an inverter 1 to the clock terminal 31.

In operation, when the first input node A is changed to the high level by the clock signal applied to the terminal 31, as shown in FIG. 3, the inverter 1 changes its output to the low level. Although the output of the inverter 1 is changed to the low level, the node B is not inverted to the low level immediately, but changed to the low level gradually in accordance the time constant determined by the resistor 2 and the capacitor 4, as shown in FIG. 3. Accordingly, the output node C of the AND gate 3 is changed to the high level in synchronism with the change in clock signal from the low level to the high level and then returned to the low level when the level at the node B exceeds the threshold level of the AND gate 4. Assuming that the resistor 2 has a resistance value R2 and the capacitor 4 has a capacitance value C4, the voltage Vb at the node B is represented as follows:

$$V_b \approx 1 - \exp\left( -\frac{T}{C_4 R_2} \right) \quad (1)$$

$$\therefore t_A = k C_4 R_2$$

Thus, the AND gate 4 produces a pulse train C which has a cycle period Tc equal to the clock signal A and a pulse width represented by TA, as shown in FIG. 3.

The pulse train from the AND gate 4 is supplied to the transistor 5 which is thereby turned ON during the high level period of the pulse train. An input signal applied to the terminal 32 is thus transferred to an integration circuit composed of the resistor 6 and the capacitor 7 through the transistor 5 during the conductive state thereof. Accordingly, the charging and discharging of the capacitor 7 is controlled by the transistor 5 which is in turn controlled by the pulse train from the AND gate 4. Assuming that the resistor 6 has a resistance value R6 and the capacitor 7 has a capacitance value C7, therefore, the cut-off frequency f of the filter circuit 200 is represented as follows:

$$f_C = \frac{1}{2\pi C_7 (T_C/T_A) R_6} = \frac{k C_4 R_2}{2\pi C_7 R_6 \cdot T_C} \quad (2)$$

As well known in the art, although the respective values of the resistors and capacitors fabricated in an integrated circuit device are deviated from the respective designed values, the ratio in value between the resistors and between the capacitors is accurate with respect to the designed value. As apparent from the equation (2), the cut-off frequency f is dependent on the ratio in value between the capacitors 4 and 7 and between the resistors 2 and 6. As a result, the deviation of the cut-off frequency f from the designed value is suppressed sufficiently. Accordingly, there is needed neither test equipment for adjusting the time constant nor testing steps therefor.

Turning to FIG. 4, there is shown a RC filter circuit 210 according to a second embodiment of the present invention in which the same constituents as those shown in FIG. 2 are denoted by the same reference numerals to omit the further description thereof. In the present embodiment, the compensation circuit 50 is different from first embodiment and further includes a comparator 8 inserted between the resistor 2 and the AND gate 3. Specifically, the comparator has (1) a non-inverting input node connected to the node B of the resistor 2 and the capacitor 4, (2) an inverting input node supplied with a reference voltage Vr, and (3) an output node connected to the second input node of the AND gate 3.

Accordingly, when the voltage level at the node B exceeds the reference voltage Vr, the AND gate 3 inverts its output level from the high level to the low level. In other words, the pulse width TA of the pulse train is determined by the reference voltage Vr, not by the threshold voltage of the AND gate 3. The reference voltage Vr is advantageous in accuracy as compared to the threshold voltage. As a result, the cut-off frequency f of the circuit 210 is less deviated from the designed value as compared to the circuit 200 shown in FIG. 2.

Figure 5:
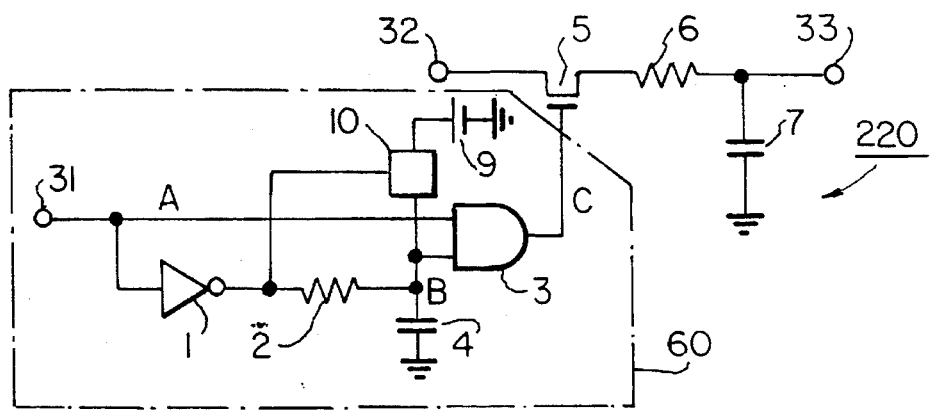
FIG. 5 is a circuit diagram illustrative of a third embodiment of the present invention.
Figure 6:
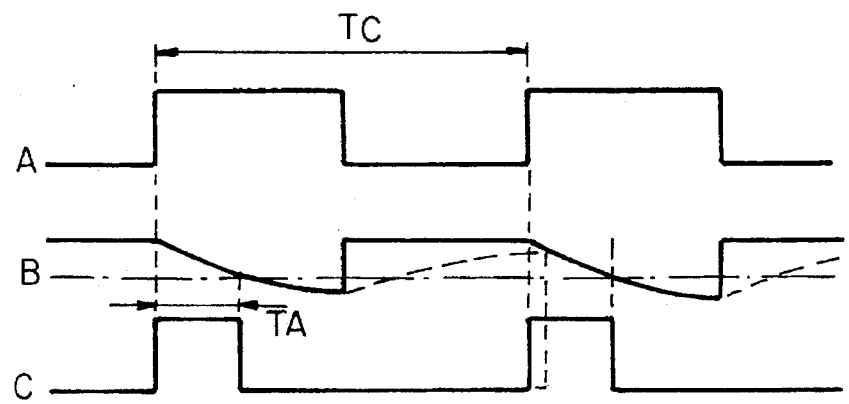
FIG. 6 is a timing chart indicative of an operation of a compensation circuit in the circuit shown in FIG. 5.

Referring to FIG. 5, a RC filter circuit 220 according to a third embodiment of the present invention has a different compensation circuit from than that of FIG. 2. The compensation circuit 60 according to the present embodiment further includes a switch 10 inserted between the node B and a voltage source 9 generating a voltage corresponding to the high level. The switch 10 is turned ON when the output of the inverter 1 is at the high level. Accordingly, when the clock signal is at the low level, the switch 10 is in the conductive state to clamp the node B at the high level. In other words, the discharging starting level of the node B is always the high level irrespective of the cycle period Tc of the clock signal, as shown in FIG. 6. The cut-off frequency of the filter circuit 220 thereby becomes more accurate. If desired, the comparator 8 can be provided in the circuit 60 in accordance with the second embodiment shown in FIG. 4.

Figure 7:
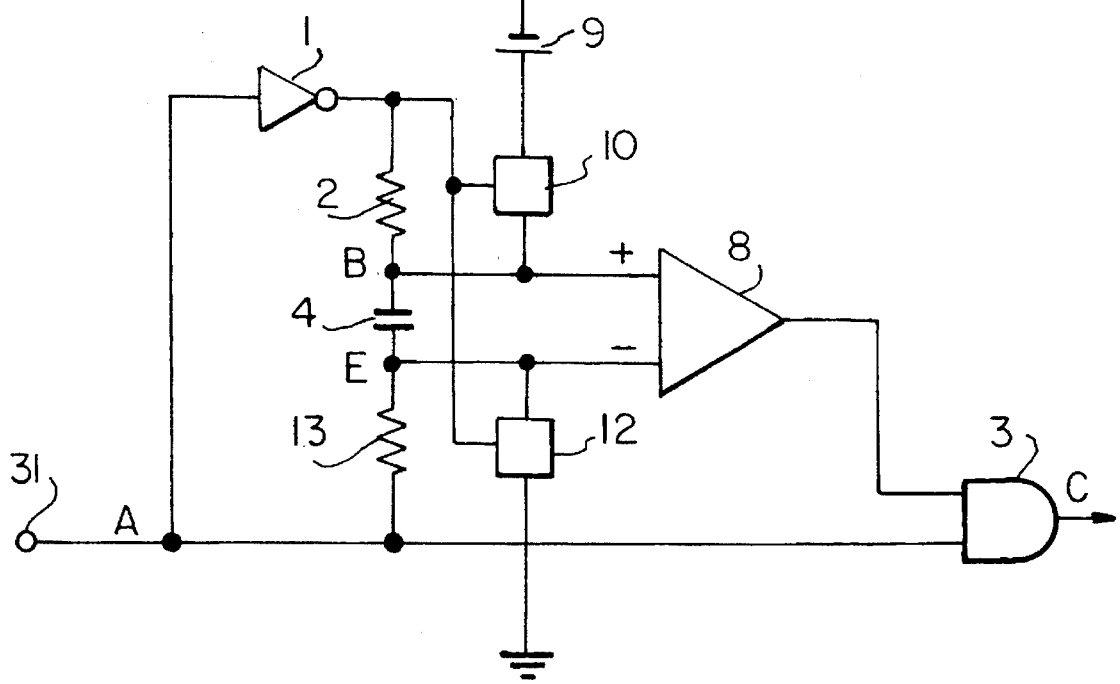
FIG. 7 is a circuit diagram illustrative of a compensation circuit of a RC filter circuit according to a fourth embodiment of the present invention.
Figure 8:
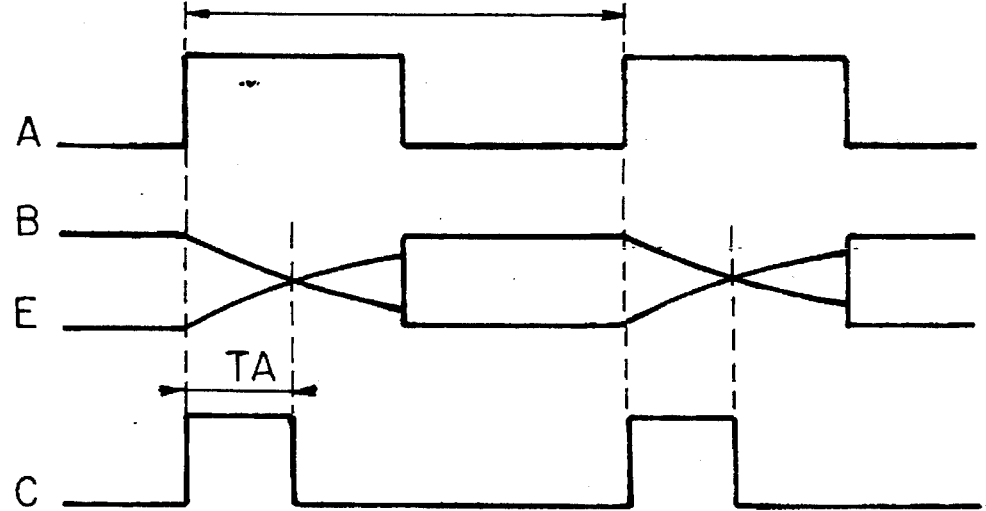
FIG. 8 is a timing chart indicative of an operation of the circuit shown in FIG. 7.

Referring to FIG. 7, a compensation circuit 70 employed in a RC filter circuit according to the fourth embodiment further includes, in addition to the combination of FIGS. 4 and 6, a resistor 13 having one end connected to the clock terminal 31 and another end defining node E. The capacitor 4 is connected to the other end E of the resistor 13 instead of the ground terminal. Further included in the circuit 70 is a switch 12 connected between the node E and the ground terminal. The comparator 8 has the inverting input node connected to the node E. The switch 12 is turned ON when the output of the inverter 1 is at the high level, like switch 10. This circuit thus has the respective advantages of the second and third embodiments, as apparent from the timing chart shown in FIG. 8.

Figure 9:
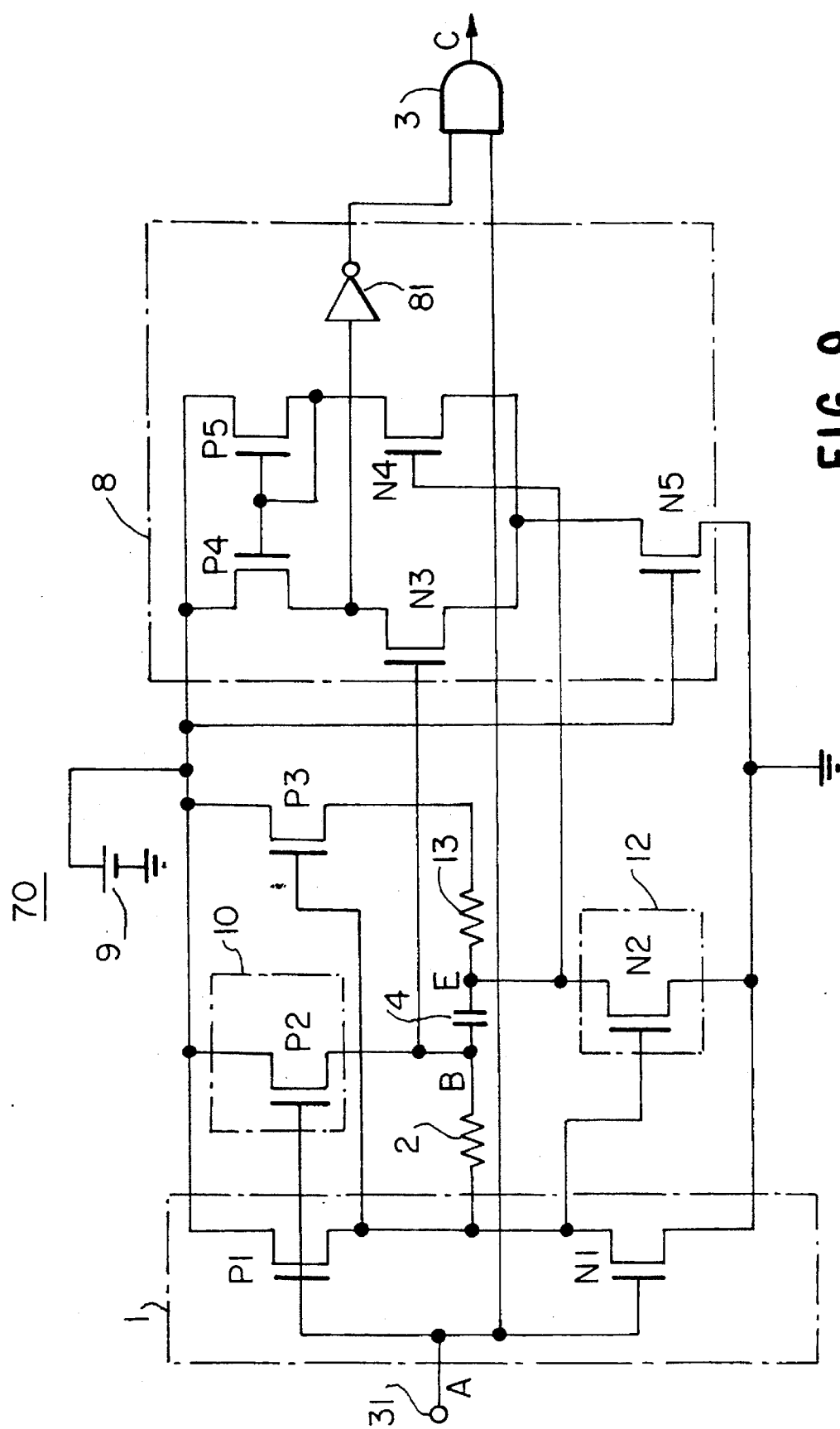
FIG. 9 is a circuit diagram for implementing the compensation circuit shown in FIG. 6 on an integrated circuit device.

The compensation circuit 70 is implemented on an integrated circuit chip as shown in FIG. 9. The inverter 1 consists of a P-channel MOS transistor P1 and an N-channel MOS transistor N1. The switches 10 and 12 are composed of a P-channel MOS transistor P2 and an N-channel MOS transistor N2, respectively. The comparator 8 is composed of P-channel MOS transistors P4 and P5, N-channel MOS transistors N3–N5, and an inverter 81, which are connected as shown. In this circuit, further, a P-channel MOS transistor P3 is provided between the high level voltage terminal VD and the resistor 13 instead of connecting the resistor 13 to the terminal 31.

It is apparent that the present invention is not limited to the above embodiments but may be modified and changed without departing from the scope and spirit of the invention.

What is claimed is:

1. A filter circuit comprising an input terminal supplied with an input signal, a first time constant circuit including a first resistor and a first capacitor, a switch circuit coupled between said input terminal and said first time constant circuit, and a pulse generator generating and supplying a pulse signal to said switch circuit to control conductive and non-conductive states of said switch circuit, said pulse generator including a second time constant circuit including a second resistor and a second capacitor and said pulse generator responding to a clock signal to generate said pulse signal which has a cycle period equal to a cycle period of said clock signal and a pulse width dependent on a time constant of said second time constant circuit.

2. The circuit as claimed in claim 1, wherein said pulse generator comprises a clock terminal supplied with said clock signal, a drive circuit coupled to said clock terminal to receive said clock signal, producing a control signal that has a phase opposite to a phase of said clock signal and charging and discharging said second time constant circuit in response to said control signal, and an output circuit coupled to said clock terminal and said second time constant circuit to receive said clock signal and an output signal of said second time constant circuit and outputting said pulse signal in response to said clock signal and said output signal.

3. The circuit as claimed in claim 2, wherein said output circuit includes a comparator and a gate circuit, said comparator having a first input node supplied with said output signal from said second time constant circuit and a second input node supplied with a reference voltage and said gate circuit receiving said clock signal and an output from said comparator to output said pulse signal.

4. The circuit as claimed in claim 2, wherein said pulse generator further comprises a reference terminal supplied with a reference potential, said second resistor and said second capacitor being connected in series between an output of said drive circuit and a said reference terminal said drive circuit charging said second capacitor through said second resistor and discharging said second capacitor without an intervention of said second resistor in response to said control signal.

5. A filter circuit comprising an input terminal supplied with an input signal, a first time constant circuit including a first resistor and a first capacitor, a switch circuit coupled between said input terminal and said first time constant circuit, and a pulse generator generating and supplying a pulse signal to said switch circuit to control conductive and non-conductive states of said switch circuit, said pulse generator including a second time constant circuit including a second resistor and a second capacitor and said pulse generator responding to a clock signal to generate said pulse generator responding to a clock signal to generate said pulse signal which has a cycle period equal to a cycle period of said clock signal and a pulse width dependent on a time constant of said second time constant circuit, wherein said pulse generator comprises a clock terminal supplied with said clock signal, a drive circuit coupled to said clock terminal to receive said clock signal, producing a control signal that has a phase opposite to a phase of said clock signal and supplying said control signal to said second time constant circuit, and an output circuit coupled to said clock terminal and said second time constant circuit to receive said clock signal and an output signal of said second time constant circuit and outputting said pulse signal in response to said clock signal and said output signal, and wherein said pulse generator further comprises a third resistor, a circuit node, a reference terminal supplied with a reference potential, a voltage terminal connected to a voltage source, and first and second switching means, said second resistor being connected between a first end of said second capacitor and an output of said drive circuit, said third resistor being connected between a second end of said second capacitor and said circuit node, said output circuit including a comparator and a gate circuit, said comparator having first and second input nodes connected respectively to said first and second ends of said second capacitor, said gate circuit receiving said clock signal and an output of said comparator to output said pulse signal, said first switching means being connected between said voltage terminal and said first input node of said comparator and rendered conductive and non-conductive in response to said control signal, said second switching means being connected between said reference terminal and said second input node of said comparator and rendered conductive and non-conductive in response to said control signal, and said circuit node being connected to said clock terminal to receive said clock signal.

6. A filter circuit for performing a filter operation on an input signal, said filter circuit comprising:

an input terminal;

a first time constant circuit, having a first resistor and a first capacitor;

a switch circuit having a conductive state and a non-conductive state;

a pulse generator which generates and supplies a pulse signal, and which includes a second time constant circuit;

said second time constant circuit having a second resistor, a second capacitor, and a respective time constant;

said switch circuit connected between said input terminal and said first time constant circuit;

said pulse signal controlling said conductive state and said non-conductive state;

said pulse generator generating said pulse signal in response to a clock signal;

said pulse signal and said clock signal each having an equal respective cycle period; and said pulse signal having a pulse width which is dependent upon said respective time constant of said second time constant circuit.

7. The filter circuit as set forth in claim 6, wherein:

said respective cycle period of said pulse signal has a duration which is comprised of a first period portion and a second period portion;

said conductive state occurs during said first period portion, and said non-conductive state occurs during said second period portion;

said input signal is transferred to said first time constant circuit during said conductive state; and said first period portion has a respective duration corresponding to said pulse width of said pulse signal.

8. The filter circuit as set forth in claim 7, wherein:

said switch circuit has a first node, a second node, and a control node;

said first node is connected to said input terminal;

said second node is connected to said first time constant circuit;

said control node is supplied with said pulse signal;

said switch circuit forms an electrical path between said first node and said second node during said first period portion; and said switch circuit disconnects said first node from said second node during said second period portion.

* * * * *

UNITED STATES PATENT AND TRADEMARK OFFICE
CERTIFICATE OF CORRECTION

PATENT NO. : 5,473,278
DATED : December 5, 1995
INVENTOR(S) : Hirohiko SHIBATA

It is certified that error appears in the above-indentified patent and that said Letters Patent is hereby corrected as shown below:

Col. 1, Line 18, delete "has the".

Signed and Sealed this

Eleventh Day of June, 1996

Attest:

BRUCE LEHMAN

Attesting Officer     Commissioner of Patents and Trademarks